United States Patent [19]

Beauchamp et al.

[11] 4,324,854
[45] Apr. 13, 1982

[54] DEPOSITION OF METAL FILMS AND CLUSTERS BY REACTIONS OF COMPOUNDS WITH LOW ENERGY ELECTRONS ON SURFACES

[75] Inventors: Jesse L. Beauchamp; Patricia M. George, both of Pasadena, Calif.

[73] Assignee: California Institute of Technology, Pasadena, Calif.

[21] Appl. No.: 126,874

[22] Filed: Mar. 3, 1980

[51] Int. Cl.³ .......................... B05D 3/06; H05K 3/18
[52] U.S. Cl. .................................. 430/296; 346/107 R; 346/158; 427/38; 427/53.1; 427/54.1; 430/298; 430/31; 427/43.1
[58] Field of Search ...................... 427/38, 53.1, 54.1; 430/298, 297, 296; 346/158, 107 R

[56] References Cited
U.S. PATENT DOCUMENTS 3,386,823 6/1968 Keller et al. ........................ 430/298
3,551,213 12/1970 Boyle ................................ 346/158
3,660,087 5/1972 Kaspaul et al. ..................... 346/158

Primary Examiner—John H. Newsome
Attorney, Agent, or Firm—Marvin E. Jacobs

[57] ABSTRACT

A thin film of material such as metal is deposited on the surface of a substrate by placing a substrate (22) into a chamber (10) containing holder (12) cooled by heat exchanger 18. A beam (56) of U.V. light from the illumination source (42) is projected through monochromator (43), mask (46) and lens (16) onto a selected area (58) of the substrate at an energy level exceeding the photoemission threshold of the surface. A slow electron (60) is ejected from the surface into the capture zone (62). A compound AB such as iron pentacarbonyl from supply (30) is leaked into the chamber (10), enters the capture zone (60) to form a highly reactive deposition fragment $A^-$ which attaches to the surface and a dissociation fragment which is evacuated through outlet (14). The deposited fragment may further dissociate to form metal deposit.

18 Claims, 2 Drawing Figures

DEPOSITION OF METAL FILMS AND CLUSTERS BY REACTIONS OF COMPOUNDS WITH LOW ENERGY ELECTRONS ON SURFACES

DESCRIPTION

Background of the Invention

The present invention relates generally to methods for vapor phase depostion of thin films and thin film microstuctures on surfaces. More particularly, the present invention relates to a method for selectively depositing a thin film from the vapor phase using a pattern of low energy electrons generated by directly irradiatig a surface with ultraviolet light or an electron beam.

Since the early 1960's, there has been an ever increasing amount of interest and research regarding the fabrication of thin-film microstructures. This extensive interest in thin-film microstructures is due, at least in part, to the realization that thousands or even millions of microelectronic circuits could potentially be integrated into a single piece of silicon less than a centimeter on a side. The increased sophistication of thin-film microstructure fabrication techniques has been and continues to be a major factor in the well-known dramatic growth of the microelectronics industry. In addition, the same technologies that are utilized for thin-film microstructure fabrication and microelectronic circuits are also useful in producing a variety of other devices including microstructure clusters having catalytic activity, Josephson microbridges and integrated optical circuits, just to name a few.

The methods of present day microfabrication techniques are basically the same. For example, in the case of microelectronic structure fabrication, the substrate or surface on which the microstructure is to be deposited is generally a wafer of silicon cut from a single crystal. The silicon wafer is oxidized to form a thin layer of silicon oxide followed by coating with photosensitive material known as "photo resist". A pattern defining the desired microstructure is then impressed in the photo resist by irradiating the surface of the resist with ultraviolet light or some other type of radiation. Depending upon the type of photo resist used, the irradiated area becomes either soluble or insoluble with regards to a given solvent.

The next step in the fabrication process involves immersing the silicon wafer with the irradiated resist into a solvent bath where the soluble portion of the photo resist is washed away leaving the desired pattern of insoluble resist. The silicon wafer is then etched to remove the oxide from the exposed areas to form a surface pattern available for the diffusion of tiny amounts of impurities to produce the desired electrical characteristics or for the deposition of thin films by thermal decomposition of gas phase compounds. By performing succession of such procedures, it is possible to form a number of layers of deposited material on the silicon wafer resulting in the formation of complex circuits.

A major problem inherent in the lithographic process as described above, is the necessity to mask or otherwise focus radiation to impress the desired image in the photo resist. Many different types of masking techniques have been designed; however, they are plagued by diffraction effects and contact masks can damage the surface of the device reducing yield. Electron-beam systems have been developed which do not require masking due to the superior resolution and depth of field of electro-optical systems. However, these systems are very expensive and long exposure times are necessary to adequately irradiate the photo resist.

It would be very desirable to provide a method for fabricating thin film microstructures which is not dependent upon a photo resist process for impressing an image on a substrate surface. One particular method for photo deposition of metal films with microscopic features from the vapor phase by ultraviolet lasers is discussed in a paper published by T. F. Deutsch, D. J. Ehrlich and R. M. Osgood (Appl. Phys. Lett. 35 (2), July 15, 1979). This method is based on the direct absorption of ultraviolet laser photons by gas phase molecules resulting in breaking organometallic molecular bonds directly by photodissociation to produce free metal atoms which then condense on a surface or substrate. The method is strongly wavelength dependent and no deposition is reported when high wattage radiation at a wavelength outside the absorption band for the gas phase metal alkyl compound was focussed on a quartz substrate.

With this method deposition of the free metal atoms is not related to characteristics of the surface. Free metal atoms can deposit non-specifically and randomly upon any given surface.

It would therefore be desirable to provide a method where the decomposition of the gas phase molecule is surface controlled such that the characteristics of the surface or substrate control the location of thin film deposition.

SUMMARY OF THE INVENTION

An improved process for the deposition of thin films on surfaces has been provided in accordance with this invention in which irradiated portions of a surface of the substrate decompose volatile compounds to form a deposit. The process is surface controlled; therefore, patterns of atoms in microscopic resolution can be deposited by selectively activating the surface. Since the process is not dependent on thermal decomposition nor on photochemical decomposition, codeposition of the two or more species can be controlled by composition of the vapor phase compounds. Since the process operates by direct surface activation, protection of the surface by photoresists is not required. Direct pattern writing can be practiced by contact masking, projection of an image through a remote mask or by raster or scan techniques in which the illumination source and substrate are moved in relation to each other.

The deposition method of the invention is simple, efficient and is capable of operation on all types of substrates whether conductive or insulating and can deposit either metallic or non-metallic deposits. The invention will find use in fabrication of electronic devices, formation of small metal clusters with catalytic activity, codeposition of two or more metals and chemical or biological analysis by selective interaction of deposited metals with specific substrate functional groups.

A thin film of material is deposited on a surface in accordance with this invention by generating low energy electrons on the surface or on a selective portion of the surface and contacting the surface with a vapor phase containing a compound capable of capturing the low energy electron and dissociating to form a coordinately unsaturated species which attaches to the adjacent surface. The species may further dissociate to form an atomic metal deposit which accumulates to form a thin film.

The process is conducted by placing the substrate in deposition zone and generating a pattern of low energy electrons on or close to the surface. Low energy electrons can be generated by irradiating the surface with photons whose energy exceeds the photoemission threshold, as slow secondary electrons formed by a high energy electron beam or from a low energy electron floodgun. The low energy electrons have energies near thermal usually from 0.0 eV to 2.0 eV. These electrons react with gas phase or physically adsorbed surface molecules within a few angstroms of the surface.

A first precursor gas containing at least one precursor compound capable of electron capture dissociation is introduced into the deposition zone, travels to the surface, captures a low-energy electron, dissociates to form a coordinately unsaturated deposition species which deposits on the surface and a dissociation moiety, preferably volatile, which remains in the surrounding atmosphere or can be evacuated from the deposition chamber.

Though the process does not operate by thermal mechanisms, it is desirable to operate at a low temperature at or below room temperature to avoid non-specific thermal decomposition and deposition on the substrate and interior surfaces of the deposition chamber or the surface of the lens from the irradiation source. An advantage of the process is the ability to deposit films at cryogenic temperatures.

These and many other features and attendant advantages of the present invention will become apparent as the invention becomes better understood by reference to the following detailed description when considered in conjunction with the accompanying drawings.

DETAILED DESCRIPTION

Figure 1:
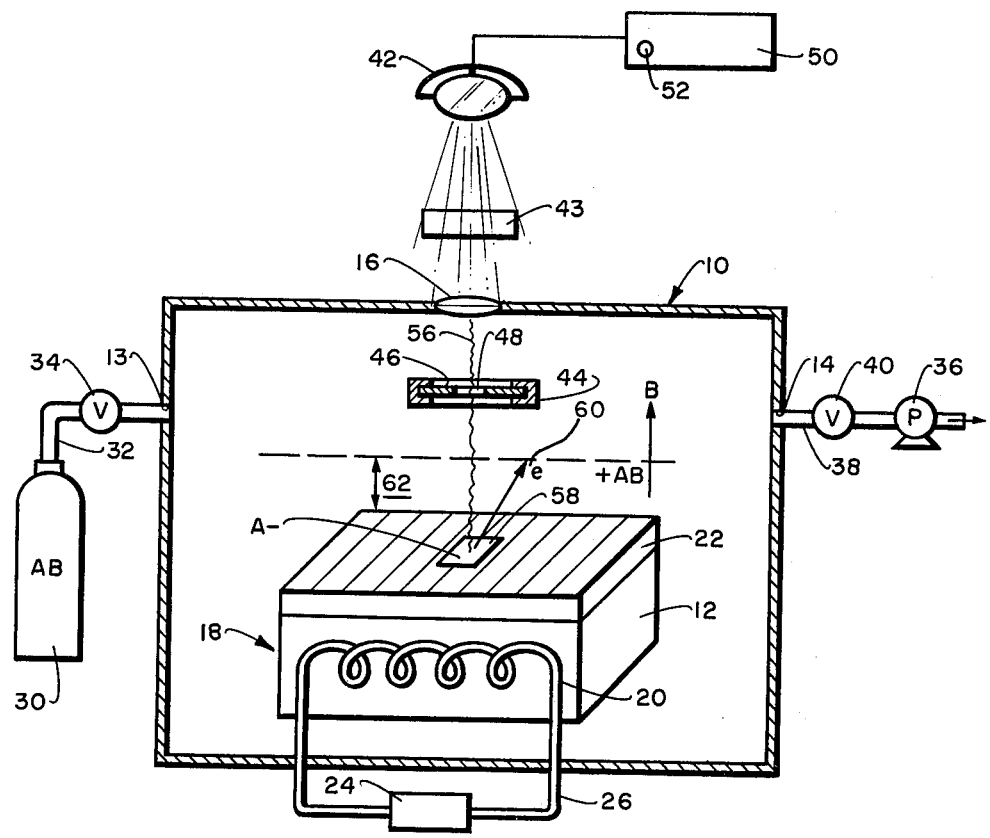
FIG. 1 is a schematic view of a depositon apparatus.

Referring now to FIG. 1 the deposition apparatus of the invention generally includes a deposition chamber 10 including a substrate holder 12, a gas inlet 13, gas outlet 14 and a window or lens 16 positioned in optical alignment with the holder 12. A heat exchanger 18 containing a heat exchange element 20 such as a coil is in thermal contact with the holder 12 for heating and cooling the holder 12 and substrate 22 as required. The coil is connected to a supply 24 of heat exchange fluid by conduits 26.

A source 30 of precursor gas is connected to the inlet 13 by means of a line 32 containing inlet valve 34 and a vacuum pump 36 is connected to the outlet 14 by means of a line 38 containing a valve 40. An illumination source 42 and mask holder 44 containing a mask 46 having an opening 48 are mounted in line with the window 16. The source is powered by power supply 50 containing a switch 52.

The apparatus is operated by placing a pre-cleaned substrate 22 on the holder 12 and operating heat exchange supply 24 to cool or heat the substrate to the desired temperature. A band pass assembly 43, such as a monochromotor, and lens is placed in position and a mask 46 is placed in mask holder 44. The switch 52 is closed and illumination source 42 such as a U.V. lamp is operated to project a beam of radiation 56 through window 16 onto a selected area 58 of the substrate 22 at an energy level exceeding the photoemission threshold of the surface. A slow electron 60 is photoejected from the surface into the capture zone 62 immediately above the surface. Valves 34 and 40 are opened and vacuum pump 36 is operated to leak a controlled amount of precursor gas containing the compound AB into the chamber 10.

A gaseous molecule AB will enter the capture zone 62 and dissociatively capture the electron 60 to form a highly reactive, coordinately unsaturated deposition fragment A and a dissociation fragment B which will be evacuated from the chamber through outlet 14. The highly reactive deposition fragment may futher dissociate to form a metal deposit which accumulates to form a film.

Futher deposits of different species can be accomplished by feeding a different gaseous compound or mixture of compounds capable of electrons capture dissociation into the chamber. Since deposition depends on the photoemission threshold, deposition can be controlled to the first microstructure deposit by adjusting the wavelength of the radiation to below the threshold of non-deposited areas but above the threshold of the deposit. Low energy electrons will only be generated by the first deposit therefore, a mask will not be required. In this manner a multilayered structure can be formed suitable for use as a microelectronic device or a catalytic metal cluster.

The substrate can be formed on any material conductive or insulating, inorganic or organic such as silicon, quartz, glass or metal, or biological specimens or suspensions since all materials can be irradiated by photons or electrons at an energy level exceeding the photoemission threshold or work function to emit low energy secondary or slow electrons.

The deposition process operates with any compound capable of electron capture dissociation. The compound should be a gas under the conditions of operation of the process and should contain at least one moiety or ligand having a bond energy less than the electron affinity of the compound. The deposition process can be generalized as follows:

| | |
|---|---|
| Generation of Photoelectrons: | $e(S) + h\nu \rightarrow e$ |
| Dissociative attachment: | $e + M(L)_n \rightarrow ML_{n-2}^- + L$ |
| Neutralization: | $ML_{n-1}^- + S \rightarrow ML_{n-1} + e(S)$ |
| Chemisorption: | $ML_{n-1} + S \rightarrow S-ML_{n-1}$ | where M is a coordinating atom such as a metal, n is an integer from 1–8, e(S) represents a surface bound electron and S is a surface site with which a coordinately unsaturated metal center can interact strongly. Futher decomposition of the attached species depends on the bond energies of the remaining ligands (L).

Compounds most favorable for electron capture dissociation are organometallic compounds of transition metals such as iron, cobalt, nickel, manganese, molybdenum, titanium, tungsten or amphoteric materials such as silicon with weakly bound ligands such as lower alkyl or carbonyl. Inorganic ligands such as halogens can also be dissociated from compounds by dissociative electron capture. Representative compounds and the dissociation products and energies are provided in the following table.

TABLE 1

| | | Dissociative Electron Energy, ev |
|---|---|---|
| $Fe(CO)_5 + e$ | $Fe(CO)_4^- + CO$ | 0.1 |
| $(n-C_5H_5)Co(CO)_2 + e$ | $(n-C_5H_5)Co(CO)^- + CO$ | ? |
| $Cr(CO)_6 + e$ | $Cr(CO_5)^- + CO$ | 0.1 |
| $Mo(CO)_6 + e$ | $Mo(CO)_5^- + CO$ | 0 |
| $W(CO)_6 + e$ | $W(CO)_5^- + CO$ | 0.15 |
| $(CH_3)_2SiCl_2 + e$ | $(CH_3)_2SiCl^- + Cl$ | 0 |

Examples of practice follow:

Two experimental arrangements were employed; one for measuring photoelectron yields as a function of wavelength, the other for metal film deposition. Both were mounted in a stainless steel vacuum chamber evacuated to $10^{-8}$ Torr by a liquid nitrogen trapped diffusion pump. Substrates used were soda line glass (2.1 cm$^2 \times$ 0.01 cm) and silver foil (2.1 cm$^2 \times$ 0.003 cm). Surface oxides were removed from the silver by abrasive cleaning. All substrates were cleaned with hexane and ethanol before heating in vacuum at $10^{-7}$ Torr. For each substrate the photoelectric yield as a function of wavelength (FIG. 2) was determined over the range 200–400 nm using a 2.5 kW Xenon-Hg arc lamp dispersed with a Bausch and Lomb 0.25 m monochromator set for a 12 nm bandpass. A standard photodiode arrangement was employed with the collector biased at 275 volts, which is above the space-charge limit.

Organometallic compounds used were iron pentacarbonyl (Alfa Products) methylcyclopentadienyl manganese tricarbonyl (Strem Chemicals). Prior to use these were freed from noncondensable impurities by repeated freeze-pump-thaw cycles at liquid nitrogen temperatures. Variable wavelength monochromatic uv light was focussed on the surface and organometallic vapor introduced via a leak valve at pressures up to $10^{-2}$ Torr as measured on a MKS Instruments Model 221 capacitance manometer. The metal films were detected by energy dispersive x-ray microprobe analysis on an ISI Model SMS 2—2 scanning electron microscope equipped with a United Scientific x-ray analyzer. Film thicknesses were estimated using nuclear backscattering techniques.

Irradiation of the glass substrate yields a thin conducting film in the presence of $10^{-2}$ Torr Fe(CO)$_5$ only when the photon energy exceeds the photoemission threshold. Failure to observe film formation at longer wavelengths (with the same photon flux) eliminates a thermal decomposition mechanism. As film deposition proceeds, the electron emission characteristics are modified. For example, a clean glass surface has a quantum yield of $3 \times 10^{-7}$ electrons photon$^{-1}$ at 5.12 eV. Irradiation of a 0.5 cm$^2$ area of the glass at this energy with a photon flux of $2.4 \times 10^{15}$ photons sec$^{-1}$ gives an electron flux of $10^{-9}$ sec$^{-1}$. This corresponds to a total yield of $10^{13}$ electrons in the vicinity of the glass surface during the irradiation period of $10^4$ sec. Thus deposition would be restricted to less than a monolayer if there was no enhancement of the yield during deposition. However, the electron flux increased by a factor of $10^2$ as deposition progressed, permitting a coverage of at least a monolayer during the irradition period. These additional electrons may be attributed to photoemission from the growing film since the irradiating photon energy is also above the photoemission threshold for iron. The film formed on the glass is highly reflecting with a brown discoloration around the edges. Under the above conditions backscattering measurements indicate a film thickness of 300. Providing there is no difficulty with the measurement of electron yields this is in excess of the amount of deposition which would correspond to one Fe atom per photoelectron. A possible explanation is that initially deposited material catalyzes the decomposition and further deposition of Fe(CO)$_5$ from the vapor phase. This phenomenon is being investigated further.

Figure 2:
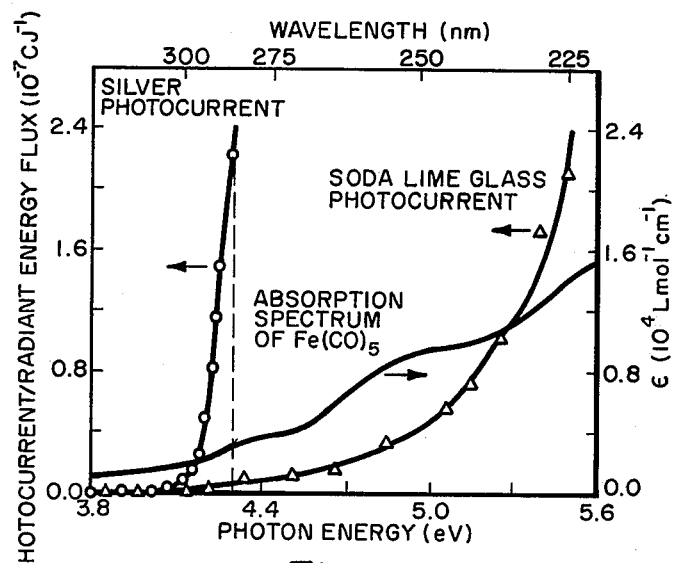
FIG. 2 is a comparison of absorption of Fe(CO)$_5$ with photoemission spectra of substrates. The dashed line indicates the photon energy (4.31 eV) at which adjacent silver and glass were simultaneously irradiated.

Similar results are obtained with silver as a substrate, the presence of iron being detected by x-ray analysis. Unlike glass, however, the film on silver appears to be uniformly discolored. The photoelectron yields for silver and soda lime glass are significantly different at all wavelengths in the vicinity of threshold (FIG. 2). Adjacent samples of silver and glass were simultaneously subjected to uniform irradiation with 4.31 eV photons, indicated by the dashed vertical line in FIG. 2. Integration of iron K lines reveals a 15:1 preference for deposition of iron on silver rather than glass. This is consistant with the 45:1 ratio of photoelectron yields for silver and glass at the same energy when the effect of the film on the electron yield is considered. This result also supports the contention that the process does not involve photodecomposition of the Fe(CO)$_5$ either on the surface or in the gas phase.

Irradiation of the glass substrate in the presence of methylcylopentadienyl manganese tricarbonyl yields a visible non-conducting film. Based on the relative strengths of metal-cyclopentadienyl and metal carbonyl bonds only the latter are easily ruptured by exothermic electron attachment. Hence the cyclopentadienyl ligand remains in the growing film and is responsible for the lack of conductivity. The above experiments are consistent with the mechanism of thin film production proposed.

Having thus described the present invention, it should disclosures are exemplary only and that various other alternatives, adaptations and modifications may be made within the scope of the present invention. Accordingly, the present invention is not limited to the specific embodiments as illustrated herein.

What is claimed is:

1. A method for depositing a thin film on the surface of a substrate comprising the steps of:
   placing said substrate in a deposition zone;
   introducing a first precursor gas containing a first compound capable of electron capture dissociation into said deposition zone;
   generating low energy electrons at or near the surface of said substrate;
   dissociatively capturing said electrons with said first compound resulting in dissociation of said first compound into a coordinately unsaturated negatively charged reactive first deposition species and a first dissociation species;
   depositing said first deposition species on the surface of said substrate; and
   removing said first dissociation species from said deposition zone.

2. The method according to claim 1 wherein said first precursor gas contains a first compound which undergoes dissociative electron capture with electrons of near thermal energies.

3. The method according to claim 2 wherein said first compound is an organometallic compound.

4. The method according to claim 1 wherein said substrate is selected from the group consisting of glass, metal or silicon.

5. The method of claim 3 wherein said organometallic compound is a metal carbonyl which dissociates by electron capture to form a negatively charged unsaturated metal carbonyl first deposition species and a carbonyl first dissociation species.

6. The method according to claim 1 wherein said deposition method is carried out in said deposition zone under vacuum less than atmospheric pressure and at a temperature below room temperature.

7. The method according to claim 1 which includes the additional steps of:

introducing a second precursor gas containing a second compound capable of electron capture dissociation into deposition communication with said first deposited species;

irradiating said first deposited species and substrates with radiation of an energy sufficient to eject low energy electrons from said first deposited species but not from said substrate;

dissociatively capturing the electrons ejected from said first deposited species resulting in dissociation of said second compound into a coordinately unsaturated negatively charged reactive second deposition species and a second dissociation species; and depositing the second deposition species on said first deposited species.

8. The method according to claim 7 wherein said deposition method is carried out in said deposition zone under a vacuum at cryogenic temperatures.

9. The method according to claim 7 wherein said second compound is an organometallic compound which dissociatively decomposes into a negatively charged metallic second deposition species and an organic second dissociation species.

10. A method for depositing a thin film on the surface of a substrate comprising the steps of:

placing said substrate in a deposition zone;

introducing a first precursor gas containing a first compound capable of electron capture dissociation into said deposition zone;

generating a pattern of low energy electrons at or near the surface of said substrate;

dissociatively capturing said electrons with said first compound precursor gas resulting in electron capture dissociation of said first compound into a coordinately unsaturated negatively charged reactive first deposition species and a first dissociation species; and depositing said first deposition species on said surface of said substrate in the pattern defined by said generated low energy photoelectrons.

11. The method according to claim 10 wherein said first precursor gas contains a first compound which undergoes dissociative electron capture with electrons of near thermal energies.

12. The method according to claim 11 wherein said first compound is an organometallic compound.

13. The method according to claim 10 wherein said substrate is selected from the group consisting of glass, metal or silicon.

14. The method of claim 11 wherein said organometallic compound is a metal carbonyl which dissociates by electron capture to form an unsaturated negatively charged metal carbonyl first deposition species and a carbonyl first dissociation species.

15. The method according to claim 10 wherein said deposition method is carried out in said deposition zone under vacuum at cryogenic temperatures.

16. The method according to claim 10 which includes the additional steps of:

introducing a second precursor gas containing a second compound capable of electron capture dissociation into communication with said first deposition species deposited on the substrate surface;

irradiating said deposited first deposition species and substrate with radiation of an energy sufficient to eject low energy photoelectrons from said deposited first deposition species but not from said substrate;

dissociatively capturing the photoelectrons ejected from said deposited first deposition resulting in dissociation of said second into a coordinately unsaturated negatively charged reactive second deposition species and a second dissociation species; and depositing the second deposition species on said deposited first deposition species.

17. The method according to claim 16 wherein said deposition method is carried-out in said deposition zone under a vacuum at cryogenic temperatures.

18. The method according to claim 16 wherein said second compound is an organometallic compound which decomposes into a negatively charged metallic second deposition species and a volatile organic second dissociation species.

* * * * *